(12) United States Patent
Kawai

(10) Patent No.: US 6,946,663 B2
(45) Date of Patent: Sep. 20, 2005

(54) METHOD OF FABRICATING MULTIPOLE LENS, MULTIPOLE LENS, AND CHARGED-PARTICLE BEAM INSTRUMENT EQUIPPED THEREWITH

(75) Inventor: Eiji Kawai, Kawasaki (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 10/811,494

(22) Filed: Mar. 26, 2004

(65) Prior Publication Data

US 2004/0251423 A1 Dec. 16, 2004

(30) Foreign Application Priority Data

Mar. 28, 2003 (JP) .................................. 2003-090279

(51) Int. Cl.⁷ ............................. H01J 49/00; H01J 3/14; G21K 1/08
(52) U.S. Cl. ......................... 250/396 ML; 250/396 R; 250/492.1; 250/492.2; 250/492.21; 250/492.3; 250/505.1; 250/517.1; 250/306; 250/307; 250/309; 250/310; 250/311; 313/389; 430/942
(58) Field of Search .................. 250/396 ML, 396 R, 250/306, 492.1, 307, 309, 310, 311, 492.2, 492.21, 492.3, 505.1, 517.1; 313/389; 430/942

(56) References Cited

U.S. PATENT DOCUMENTS

| | | | | |
|---|---|---|---|---|
| 3,387,241 A | * | 6/1968 | Audoin et al. | 335/210 |
| 4,039,810 A | * | 8/1977 | Heritage | 250/396 ML |
| 6,515,287 B2 | * | 2/2003 | Notte, IV | 250/396 ML |
| 6,891,167 B2 | * | 5/2005 | Notte, IV | 250/396 ML |
| 2002/0074495 A1 | * | 6/2002 | Notte | 250/311 |
| 2004/0251423 A1 | * | 12/2004 | Kawai | 250/396 R |
| 2005/0029466 A1 | * | 2/2005 | Kawai et al. | 250/396 R |

FOREIGN PATENT DOCUMENTS

JP 02-230647 9/1990

* cited by examiner

Primary Examiner—John R. Lee
Assistant Examiner—Bernard E. Souw
(74) Attorney, Agent, or Firm—The Webb Law Firm

(57) ABSTRACT

A method of efficiently fabricating a multipole lens. The multipole lens has plural polar elements and an annular holding member. Each polar element has a held portion. The annular holding member is provided with through-holes for holding the held portions of the polar elements. A resin is injected into the through-holes in the holding member via openings formed in the holding member, the openings being in communication with the through-holes. The injected resin is cured, thus holding the held portions of the polar elements to the holding member within the through-holes.

15 Claims, 6 Drawing Sheets

METHOD OF FABRICATING MULTIPOLE LENS, MULTIPOLE LENS, AND CHARGED-PARTICLE BEAM INSTRUMENT EQUIPPED THEREWITH

BACKGROUND OF THE INVENTION

1. Field of the Invention

The present invention relates to a method of fabricating a multipole lens having multipole elements, such as octopoles or dodecapoles and also to the multipole lens. Furthermore, the present invention relates to a charged-particle beam instrument fitted with such multipole lenses.

2. Description of Related Art

In a charged-particle beam instrument such as a scanning electron microscope, aberration in the electron beam that is a charged-particle beam is corrected when the beam is directed at a specimen, in order to appropriately image the specimen. A multipole lens is mounted as an aberration corrector within this charged-particle beam instrument to correct the aberration in the beam.

A known construction of this multipole lens as shown in Japanese Patent Laid-Open No. H2-230647 has plural (e.g., 8 or 12) multipole elements which are supported by an annular holding member and a yoke disposed outside the holding member.

This multipole lens (multipole elements) described in the above-referenced Japanese patent application is described below. The multipole lens shown in FIG. 1 of the above-referenced Japanese patent application has mounting rods, plural polar elements consisting of polepieces coupled to the front ends of the mounting rods, a beam tube, and an annular yoke (annular iron circuit) disposed outside the beam tube. This tube is provided with holes to permit passage of the mounting rods of the polar elements and to form a hermetic seal.

Each polar element is formed by screwing the front-end portion of the mounting rod into the polepiece or adhesively bonding or welding them together. The mounting rods and polepieces forming the polar elements are made of a magnetic material. The beam tube is made of an electrically insulating material. A metallic coating is formed around the holes.

The mounting rods of the polar elements are firmly coupled to the yoke at their base ends. The mounting rods are hermetically and rigidly mounted within the holes in the beam tube by welding via the metallic film. Thus, this weldment forms a hermetically sealed body.

A coil is mounted on each mounting rod between the beam tube and yoke. The polepieces bonded to the front-end portions of the mounting rods are excited by electrically energizing the coils. The base-end portions of the mounting rods are inserted in the holes of the yoke via insulators. Electric terminals are connected with their respective base-end portions, and voltages are supplied.

During fabrication of the multipole lens of the construction described above, the mounting rods forming the polar elements and the holes in the beam tube are firmly bonded together by welding. At this time, the polar elements have been placed in position. At least the welded portions are heated. The heat applied during this welding is transmitted also to the beam tube by thermal conduction and to the mounting rods forming the polar elements. Furthermore, the heat is transmitted to the polepieces at the front ends of the rods.

For this reason, during the welding, the polar elements and beam tube expand thermally. If the heat is subsequently dissipated away and they return to room temperature, their shapes might not be completely returned to their original shapes. In this case, the polar elements are deformed from the state in which they have been previously placed in position. Therefore, after the welding step, it is necessary to modify the shapes of the polar elements by cutting. In this way, labor is required. Hence, the manufacturing efficiency is not good.

SUMMARY OF THE INVENTION

It is an object of the present invention to provide a simple and efficient method of fabricating a multipole lens.

It is another object of the present invention to provide a multipole lens fabricated by this method.

It is a further object of the present invention to provide a charged-particle beam instrument fitted with this multipole lens.

A method in accordance with the present invention is used to fabricate a multipole lens having plural polar elements each having a held portion and an annular holding member provided with through-holes for holding the held portions of the polar elements. The method starts with injecting a resin into the through-holes in the holding member via openings formed in the holding member, the openings being in communication with the through-holes. The injected resin is cured, thus fixing the held portions of the polar elements to the holding member within the through-holes.

Another method in accordance with the present invention is used to fabricate a multipole lens having plural polar elements each having a held portion and an annular holding member provided with through-holes for holding the held portions of the polar elements. The method starts with inserting the held portions of the polar elements into the through-holes in the holding member. Then, resin injection means having a discharge port is placed to bring the discharge port into contact with the opening. The opening is in communication with the through-holes formed in the holding member. A resin is held in the resin injection means. Then, the holding member and resin injection means are placed in a vacuum ambient while the held portions of the polar elements are inserted in the through-holes. In this ambient, the gas inside the through-holes in the holding member is withdrawn from the through-holes. In this way, the resin is injected into the through-holes in the holding member and cured there.

A multipole lens according to the present invention has plural polar elements each having a held portion and an annular holding member provided with through-holes. The held portions of the polar elements are inserted in the through-holes. These holes are filled with a resin. This multipole lens is characterized in that the holding member is provided with openings that are in communication with the through-holes in the holding member and used to inject the resin into the through-holes.

A charged-particle beam instrument according to the present invention has a source of a charged-particle beam for emitting a beam of charged particles, a lens system for controlling the emitted beam to direct it at a specimen, and a multipole lens for correcting aberration in the beam. This multipole lens has plural polar elements each having a held portion, and an annular holding member provided with through-holes. The held portions of the polar elements are inserted in the through-holes. These holes are filled with a resin. The holding member is provided with openings in communication with the through-holes in the holding member of the multipole lens to inject the resin into the through-holes.

Other objects and features of the invention will appear in the course of the description thereof, which follows.

DESCRIPTION OF THE PREFERRED EMBODIMENTS

The preferred embodiments of the present invention are hereinafter described in detail with reference to the drawings.

Figure 1:
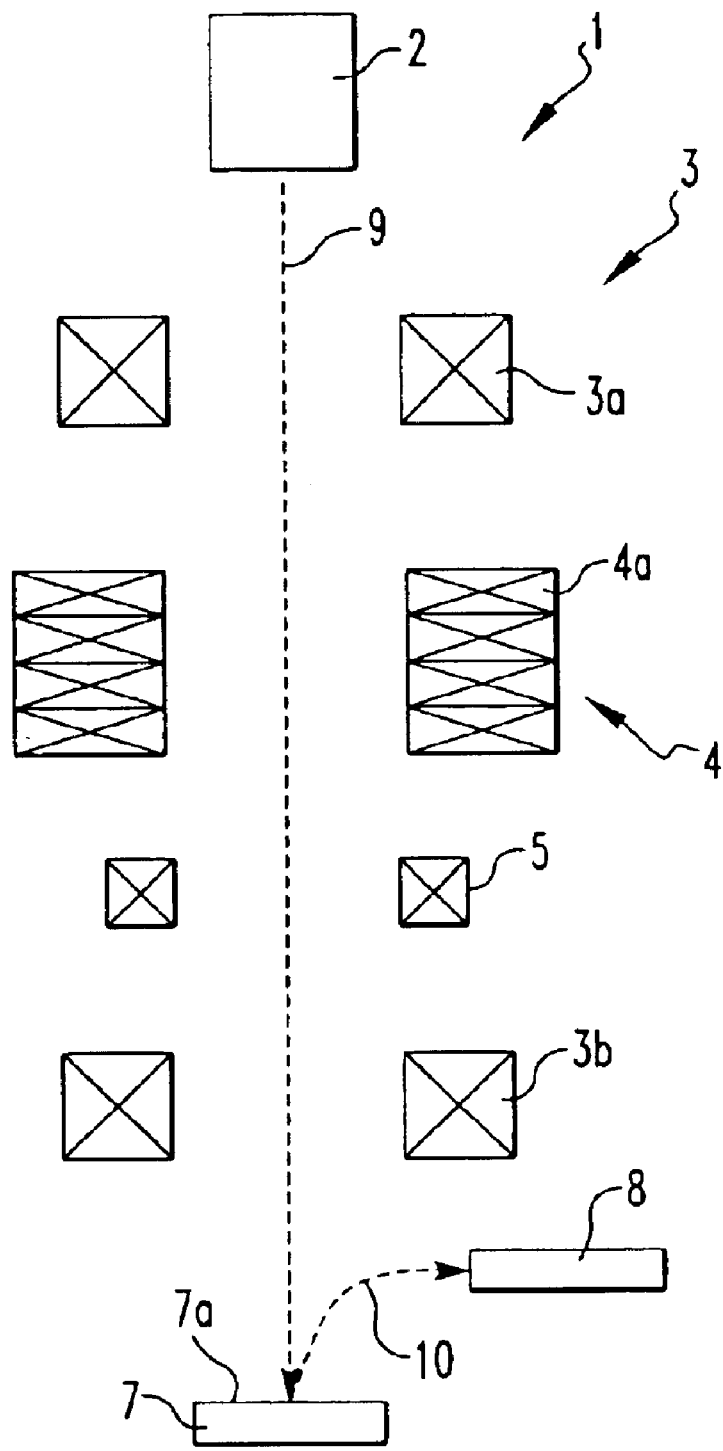
FIG. 1 is a schematic diagram of a charged-particle beam instrument fitted with multipole lenses according to the present invention.

FIG. 1 is a schematic diagram showing a charged-particle beam instrument fitted with multipole lenses according to the present invention. In the present embodiment, a scanning electron microscope is used as an example of a charged-particle beam instrument. The scanning electron microscope, indicated by numeral 1, has an electron gun 2 acting as a source of a beam of charged particles, condenser lenses 3a, an aberration corrector 4, scan coils 5, an objective lens 3b, and a detector 8.

In this scanning electron microscope 1, an electron beam (charged-particle beam) 9 emitted and accelerated from the electron gun 2 is controlled by an illumination lens system 3 and sharply focused onto an observed surface 7a of a specimen 7. The illumination lens system 3 is composed of the condenser lenses 3a and the objective lens 3b. At this time, the electron beam 9 is appropriately deflected and scanned over the observed surface 7a of the specimen 7 by the scan coils 5.

Electrons 10 to be detected, such as secondary electrons or backscattered electrons, are produced from the observed surface 7a of the specimen 7 according to the state of the observed surface 7a illuminated with the electron beam 9. The detected electrons 10 are detected by the detector 8 as an observed image of the specimen 7. The output image signal from the detector 8 indicative of the detected electrons 10 is appropriately amplified and sent to a control circuit (not shown). Then, the signal is sent to a display means (not shown), such as a CRT (cathode-ray tube) or LCD (liquid-crystal display), and displayed as the observed image.

When the electron beam 9 is focused by the illumination lens system 3 and directed at the observed surface 7a of the specimen 7, the beam passes through the aberration corrector 4. This corrector 4 is used to correct aberration in the electron beam 9. In the present embodiment, the corrector 4 is made up of four stages of multipole lenses 4a.

Figure 2:
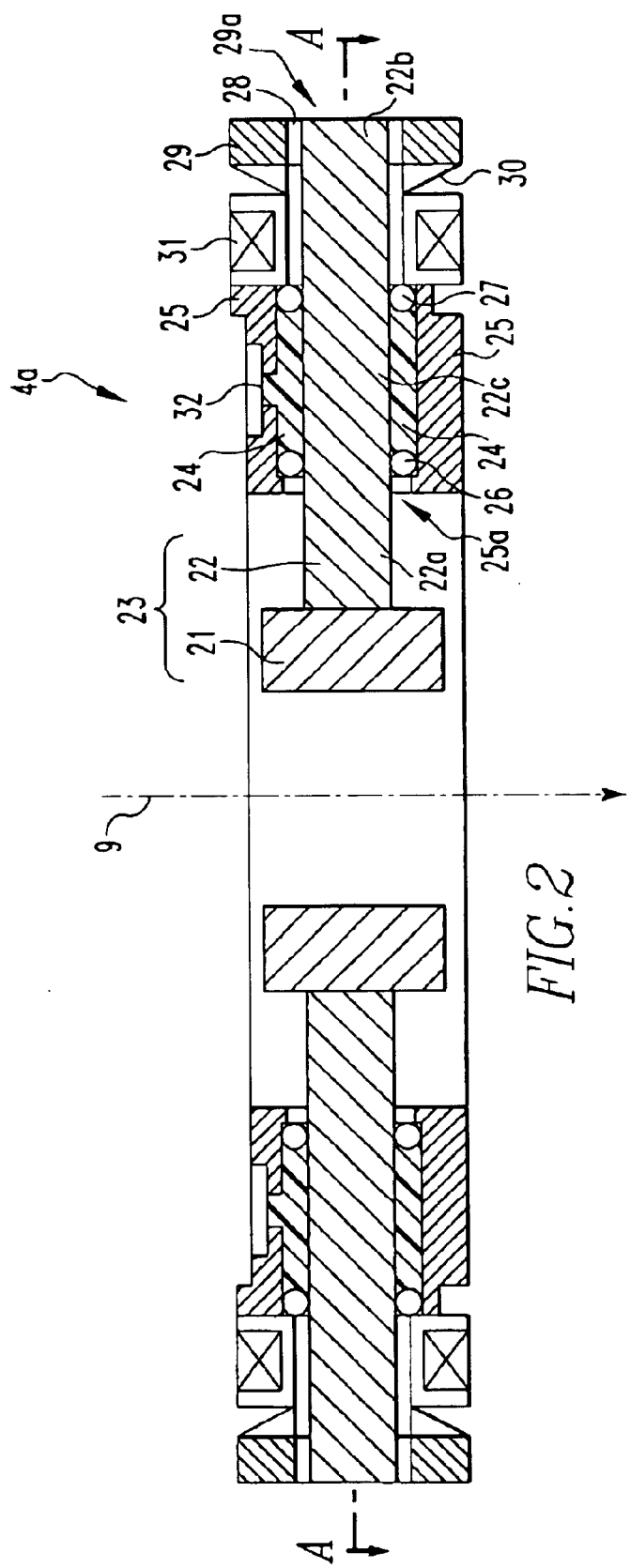
FIG. 2 is a cross-sectional view showing one stage of multipole lens according to the present invention having angularly-spaced polar elements supported by a disc-shaped holding member with radial through-holes securing the polar elements.

FIG. 2 is a cross-sectional view of one stage of multipole lens 4a forming the aberration corrector 4. This multipole lens 4a has polar elements 23, an annular holding member 25 having radial through-holes for holding the polar elements 23, and an annular yoke 29 disposed outside the holding member 25. Each polar element 23 consists of a polepiece 21 and a support rod 22. The polar element 23 is made up of the support rod 22 and polepiece 21 mounted at the front end 22a of the rod 22. The rod 22 and polepiece 21 are made of a magnetic material, such as Permalloy or iron. The polepiece 21 can be mounted to the support rod 22 by screwing, adhesive bonding, welding, or other fixing method.

The support rods 22 forming the polar elements 23 have held portions 22c inserted in the radial through-holes 25a formed in the holding member 25 made of a nonmagnetic material, such as bronze or phosphor bronze. Seal members 26 and 27 each consisting of an O-ring are disposed at the opposite ends of each through-hole 25a. The region of the inside of the through-holes 25a which is located between the outer surface of the held portion 22c of the rod 22 and the inner surface of the through-holes 25a and between the two seal members 26 and 27 is filled with a resin 24. The resin 24 is cured in this region of the inside of the through-holes 25a. Consequently, the held portion 22c of the support rod 22 is firmly mounted in the through-holes 25a in the holding member 25 via the cured resin 24. Thus, the polar element 23 is placed and held in position on the holding member 25 in the held portion 22c.

The support rod 22 forming the polar element 23 has a base-end portion 22b fitted in the yoke 29 made of a magnetic material, such as Permalloy or iron. The yoke 29 has grooves 29a in which the base-end portions 22b of the support rods 22 are inserted. Thus, the support rods 22 of the polar elements 23 are magnetically coupled to the yoke 29. A power supply (not shown) for applying a given voltage is connected with the end surfaces of the base-end portions of the support rods 22.

A coil 31 for exciting the polar element 23 is disposed on the support rod 22 of each polar element 23 and between the holding member 25 and yoke 29. A leaf spring 30 is disposed between the coil 31 and yoke 29 to limit the position of the coil 31. A tubular insulator 28 is mounted on the outer surface of the base-end portion 22b of each rod 22 that faces the grooves 29a in the yoke 29, leaf springs 30, and coils 31.

The holding member 25 is provided with openings 32 that are in communication with the through-holes 25a in the holding member 25. The resin 24 filling the through-holes 25a is injected via the openings 32 in communication with the through-holes 25a as described later.

Figure 3:
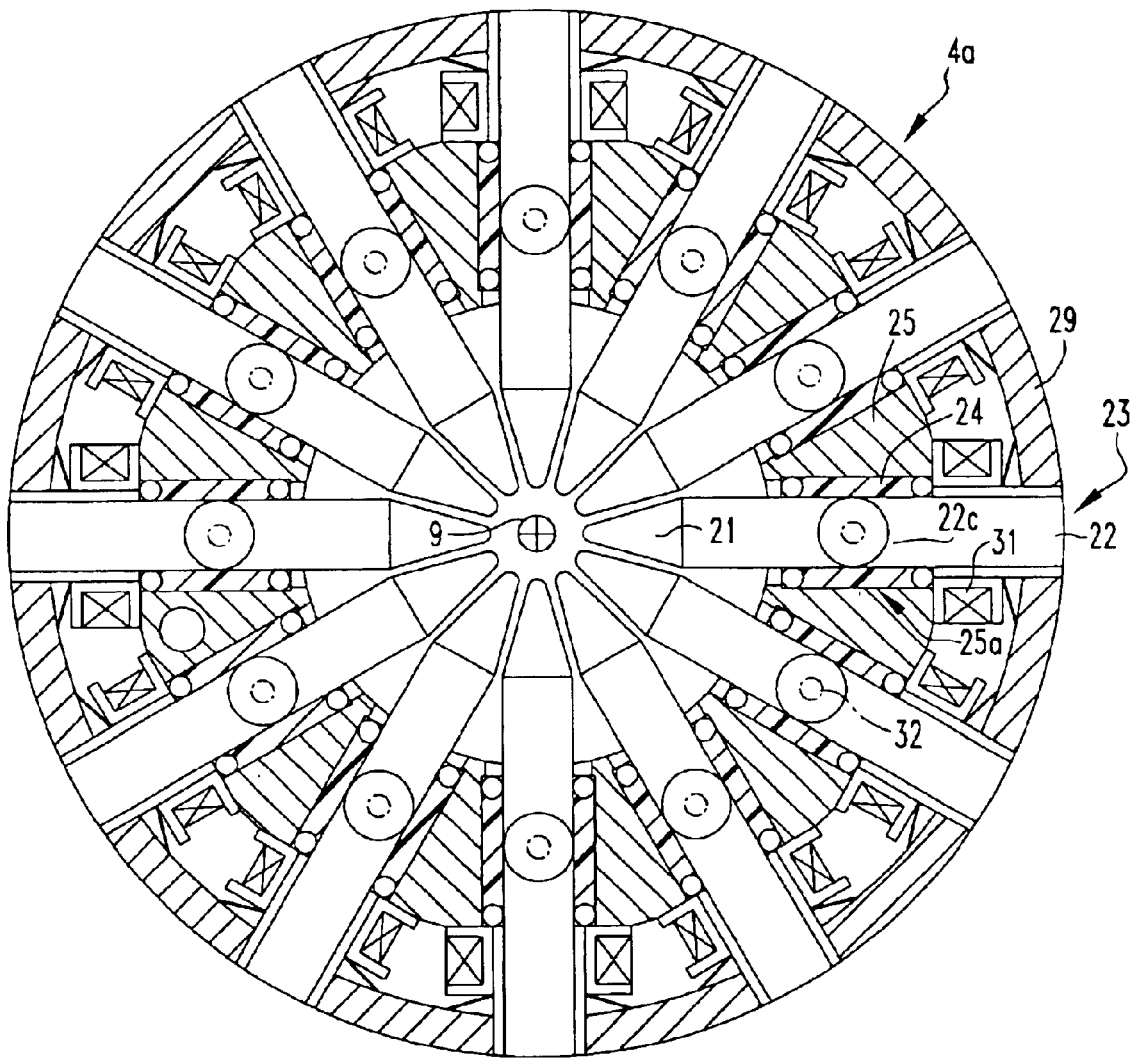
FIG. 3 is a cross-sectional view taken on line A—A of FIG. 2.

A cross section taken on line A—A of FIG. 2 is shown in FIG. 3. As shown in FIG. 3, the polar elements 23 are disposed radially about the optical axis of the electron beam 9. In the present embodiment, the multipole lens 4a has twelve polar elements 23. The holding member 25 is provided with the through-holes 25a corresponding to the support rods 22 of the polar elements 23. The held portions 22c of the rods 22 of the polar elements 23 are inserted in the through-holes 25a. The openings 32 in communication with their respective through-holes 25a are formed in the holding member 25. The through-holes 25a are filled with the resin 24.

Figure 4:
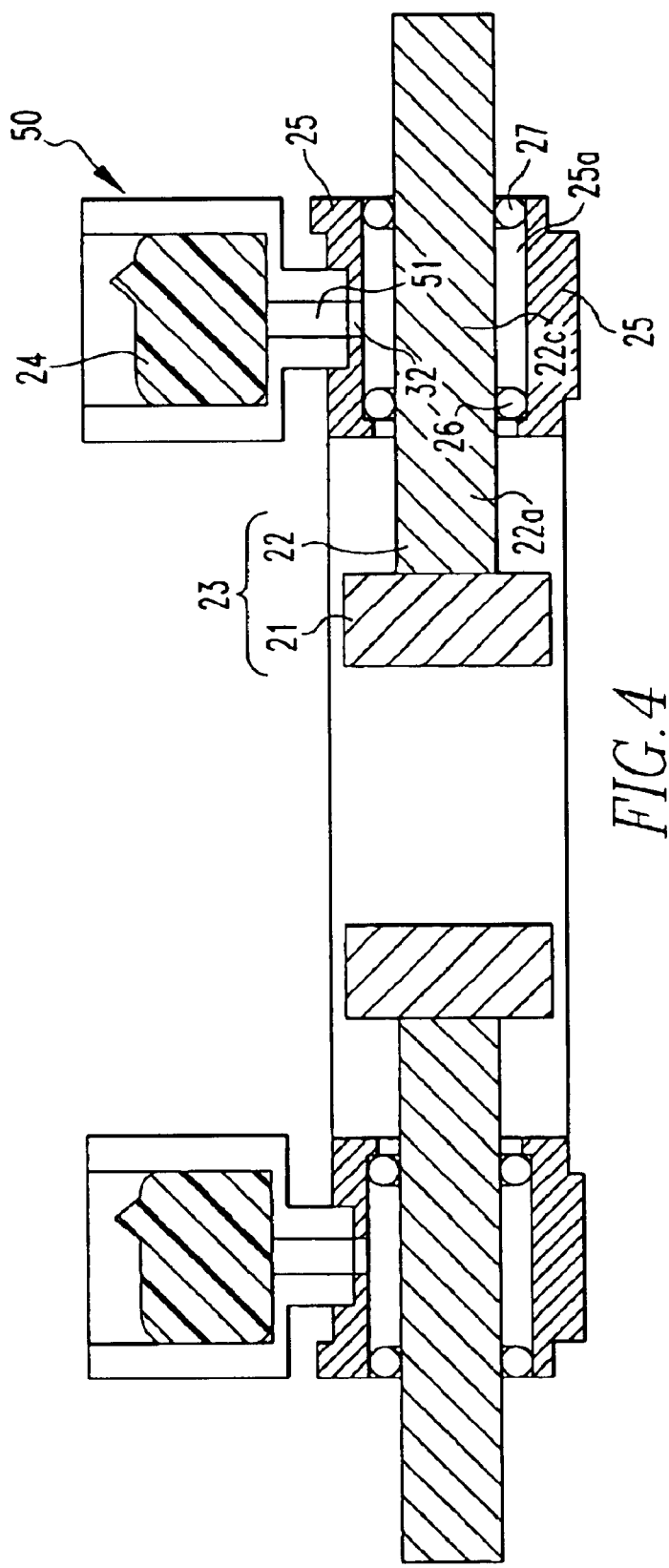
FIG. 4 is a schematic cross section showing a state assumed before a resin is injected by a method of fabricating a multipole lens in accordance with the present invention.
Figure 5:
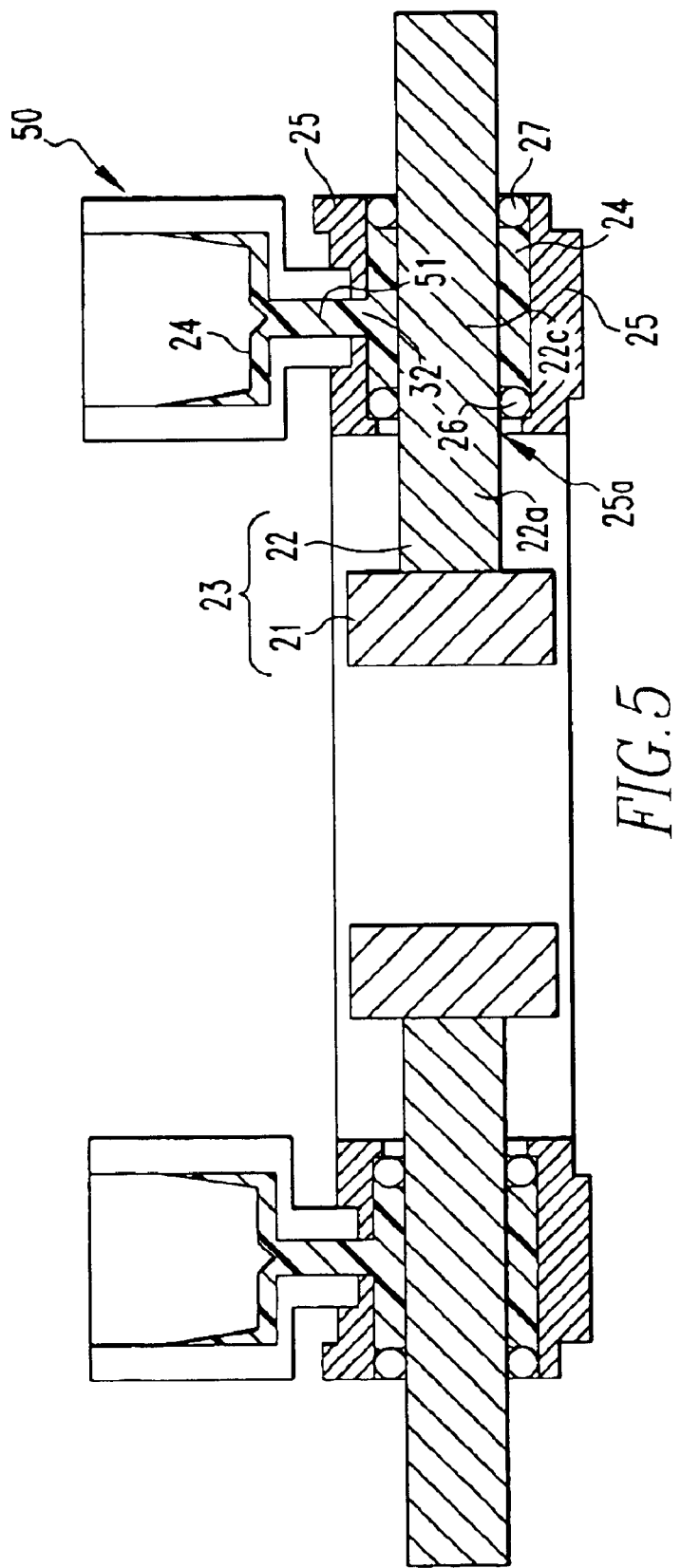
FIG. 5 is a schematic cross section showing a state assumed when the resin is being injected by a method of fabricating a multipole lens in accordance with the present invention.
Figure 6:
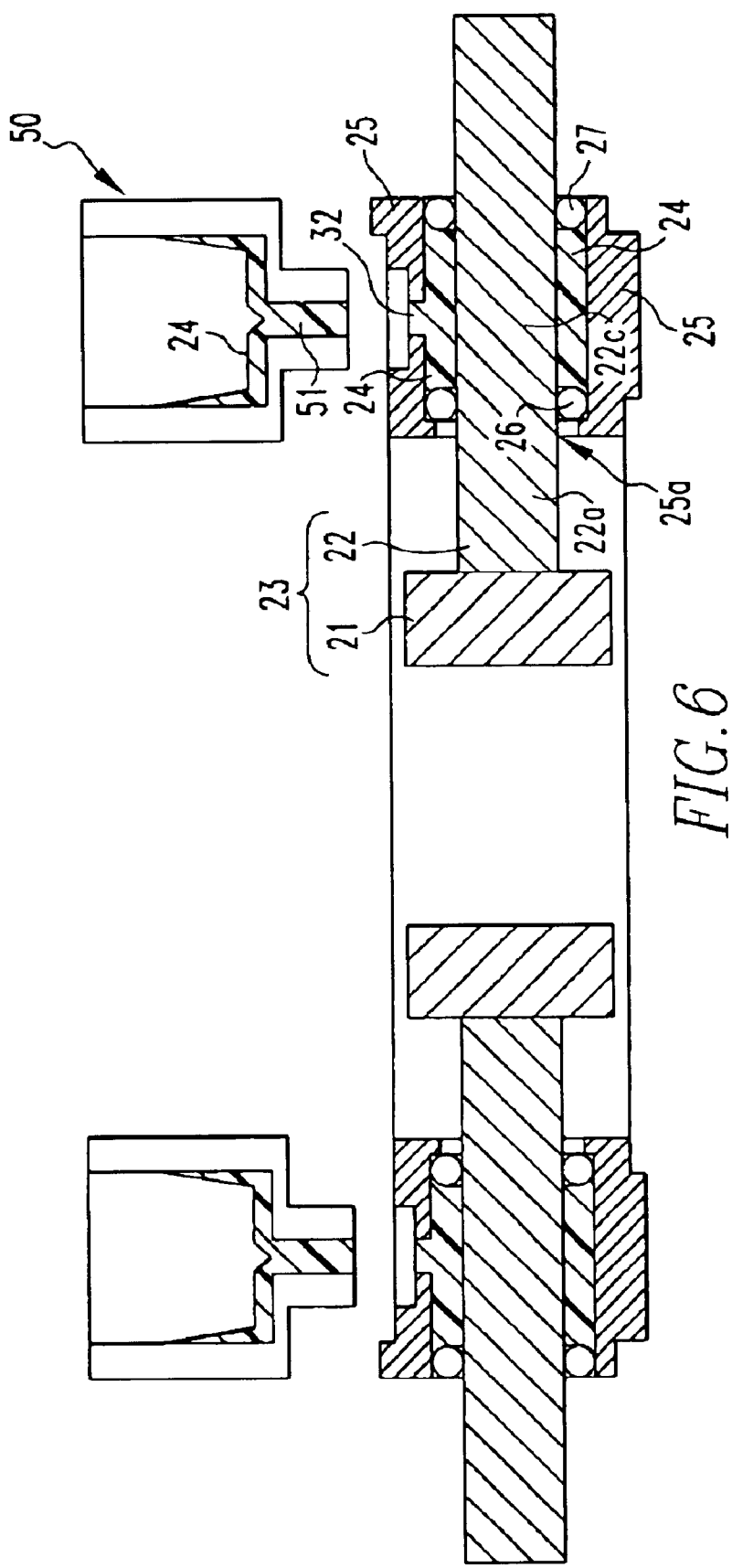
FIG. 6 is a schematic cross section showing a state assumed after the resin has been injected by a method of fabricating a multipole lens in accordance with the present invention.

A method of fabricating a multipole lens according to the present invention is next described by referring to FIGS. 4–6. FIG. 4 is a schematic cross section showing the state assumed before the resin is injected. FIG. 5 is a schematic cross section showing the state in which the resin is being injected. FIG. 6 is a schematic cross section showing the state assumed after the injection.

Referring first to FIG. 4, the support rods 22 for forming the polar elements 23 are inserted into the through-holes 25a formed in the holding member 25. The polepieces 21 are mounted to the front ends 22a of the support rods 22, thus forming the polar elements 23 each made of the support rod 22 and polepiece 21. Then, the polar elements 23 are placed in position. The two seal members 26 and 27 each consisting of an O-ring have been passed through given portions of each support rod 22. In consequence, the seal members 26 and 27 are hermetically attached to the opposite ends of each through-hole 25a. In the present embodiment, there are twelve polepieces 21 and so the holding member 25 is provided with twelve through-holes 25a corresponding to the polepieces 21, respectively. Also, twelve openings 32 in communication with their respective through-holes 25a are formed.

After the polar elements 23 have been placed in position, resin injection means 50 are placed on the top surface of the holding member 25 as shown in FIG. 4. The resin 24 is received in the resin injection means 50, which are provided with discharge ports 51 for discharging the resin 24. One example of the resin 24 received in the resin injection means 50 is a two-component epoxy-based resin. This resin is a room temperature curing resin, i.e., cures when allowed to stand at room temperature for a given time. At this time, the viscosity of the resin is approximately 10,000 to 80,000 Pa·s, for example. When the resin injection means 50 are placed on the top surface of the holding member 25, the discharge ports 51 of the injection means 50 are brought into contact with the openings 32 in communication with the through-holes 25a in the holding member 25. To inject the resin 24 into the 12 through-holes 25a formed in the holding member 25 via the openings 32 simultaneously, the number of the resin injection means 50 is 12, the same as the through-holes 25a. The 12 resin injection means 50 are so positioned that the discharge ports 51 of the resin injection means 50 come into contact with their respective openings 32 in the holding member 25.

More specifically, the support rods 22 of the polar elements 23 are inserted into the through-holes 25a in the holding member 25 in this way. The resin injection means 50 are placed on top of the holding member. Under this condition, the holding member 25 is placed into a vacuum vessel (not shown) together with the resin injection means 50. The inside of the vacuum vessel is pumped down to a given degree of vacuum (pressure). At this time, the pressure is about less than 13.3 Pa (about 0.1 Torr). In this way, the holding member 25 is placed in an ambient of this degree of vacuum under the above-described state in order to exhaust the through-holes of gas (air) therein.

Under this state, the holding member 25 is placed in the given vacuum ambient. When a given time has elapsed, the gas in the through-holes 25a formed in the holding member 25 is pumped out via the openings 32 and via the adjoining discharge ports 51 in the openings. In this way, the gas in the through-holes 25a is withdrawn from the through-holes 25a. Subsequently, the ambient in the vacuum vessel is returned to normal pressure (atmospheric pressure). The atmospheric pressure is applied to the resin 24 within the resin injection means 50. Because of the fluidity of the resin 24, the resin is injected into the through-holes 25a in the holding member 25 via the openings 32 and via the adjoining discharge ports 51 of the resin injection means 50 as shown in FIG. 5. As a result, the inside of each through-hole 25a in the holding member 25 becomes filled with the resin 24. As mentioned previously, the seal members 26 and 27 are hermetically attached to the opposite ends of each through-hole 25a in the holding member 25 and so no gas flows into the through-holes 25a from its opposite ends during the injection of the resin 24.

After the through-holes 25a in the holding member 25 have become filled with the resin 24 in this way, the holding member 25 is taken out of the vacuum vessel while the resin injection means 50 are left on the top surface of the holding member 25.

The injection of the resin 24 may also be carried out as follows. The holding member 25 on which the resin injection means 50 are placed as described previously is placed in the vacuum ambient within the vacuum vessel. After a lapse of a given time, the inside of the vacuum vessel is placed in a pressurized ambient and then the resin 24 is injected. In this case, after the end of injection of the resin 24 in the pressurized ambient, the inside of the vacuum vessel is returned to normal pressure. Then, the holding member 25 is taken out.

Then, as shown in FIG. 6, the resin injection means 50 placed on the top surface of the holding member 25 are taken out. In this state, the holding member is allowed to stand at room temperature for a given time. Since the resin 24 injected in the through-holes 25a in the holding member 25 is a room temperature curing two-component epoxy-based resin, the resin 24 cures. The held portions 22c of the support rods 22 of the polar elements 23 are firmly held by the resin 24 within the through-holes 25a in the holding member 25. Consequently, the polar elements 23 which have been placed in position are fixed.

In the above embodiment, the resin 24 is allowed to stand at room temperature to cure it after the resin injection means 50 are removed from the top surface of the holding member 25 in this way. Instead, the holding member 25 may be allowed to stand at room temperature to cure it while the resin injection means 50 are left on the top surface of the holding member 25. In this case, the resin injection means 50 are removed from the top surface of the holding member 25 after the resin 24 cures. At this time, the cured resin 24 located between the top surface of the holding member 25 and the resin injection means 50 is severed by applying an external force to the resin injection means 50. This makes it possible to separate the resin injection means 50 from the top surface of the holding member 25.

Subsequently, as shown in FIG. 2, tubular insulators 28 are mounted to the base-end portions 22b of the support rods 22 forming the polar elements 23, respectively. The coil 31 and leaf spring 30 are positioned around each insulator. Then, the yoke 29 is placed outside the annular holding member 25. At this time, it follows that the coil 31 and leaf spring 30 are positioned between the holding member 25 and yoke 29.

In this way, in the present invention, the held portions of the support rods forming the polar elements are inserted in the through-holes formed in the holding member. The resin is injected into the through-holes via the openings in communication with the through-holes. The injected resin is cured, thus holding the held portions of the polar elements within the through-holes. Hence, the polar elements can be held by a straightforward procedure. Multipole lenses can be fabricated efficiently. Since a two-component epoxy resin that cures at room temperature is used as the resin injected into the through-holes in the holding member, it is not necessary to heat the resin during curing. It is unlikely that the polar elements and holding member placed in position expand thermally. Consequently, it is not necessary to modify the shape of the polar elements by cutting or other processing method.

Having thus described my invention with the detail and particularity required by the Patent Laws, what is desired protected by Letters Patent is set forth in the following claims.

The invention claimed is:

1. A method of fabricating a multipole lens having a plurality of polar elements and an annular holding member, each of said polar elements having a held portion, said annular holding member being provided with radial through-holes for holding the held portions of the polar elements, said method comprising the steps of:
   injecting a resin into the radial through-holes in the holding member via openings formed in the holding member, the openings being in communication with the radial through-holes; and
   curing the injected resin to thereby fix the held portions of the polar elements to the holding member within the radial through-holes.

2. A method of fabricating a multipole lens having a plurality of polar elements and an annular holding member, each of said polar elements having a held portion, said annular holding member being provided with radial through-holes for holding the held portions of the polar elements, said method comprising the steps of:
   inserting the held portions of the polar elements into the radial through-holes in the holding member;
   preparing resin injection means in which a resin is held, the resin injection means having a discharge port;
   placing the resin injection means such that the discharge port is brought into contact with the opening formed in the holding member, the opening being in communication with the radial through-holes; and
   placing the holding member in a vacuum ambient together with the resin injection means while the held portions of the polar elements are inserted in the radial through-holes in order to exhaust the through-holes of gas therein,
   whereby the resin is injected into the radial through-holes in the holding member and cured there.

3. A method of fabricating a multipole lens as set forth in claim 2, wherein said step of injecting the resin is carried out by increasing the pressure of said ambient after exhausting the through-holes of the gas therein.

4. A method of fabricating a multipole lens as set forth in claim 1 or 2, wherein a seal member is mounted on the opposite end of the radial through-holes in the holding member.

5. A method of fabricating a multipole lens as set forth in claim 1 or 2, wherein the injected resin is a two-component epoxy-based resin.

6. A method of fabricating a multipole lens as set forth in claim 1 or 2, wherein the multipole lens further includes an annular yoke magnetically coupled to the outer radial ends of the polar elements.

7. A multipole lens having a plurality of polar elements and an annular holding member, each of said polar elements having a held portion, said annular holding member being provided with radial through-holes in which the held portions of the polar elements are inserted, the radial through-holes being filled with a resin,
   wherein the holding member is provided with openings in communication with the radial through-holes in the holding member to inject the resin into the radial through-holes.

8. A multipole lens as set forth in claim 7, wherein a sealing member is mounted on opposite radial ends of the through-holes in the holding member.

9. A multipole lens as set forth in claim 7, wherein the resin filling the radial through-holes in the holding member is a two-component epoxy-based resin.

10. A multipole lens as set forth in claim 7, further comprising an annular yoke magnetically coupled to the outer radial ends of the polar elements.

11. A charged-particle beam instrument fitted with a multipole lens, said instrument having a source of a charged-particle beam for emitting a beam of charged particles, a lens system for controlling the emitted beam to direct it at a specimen, and said multipole lens for correcting aberration in the beam,
   wherein said multipole lens has plural polar elements each having a held portion, and an annular holding member provided with radial through-holes, the held portions of the polar elements being inserted in the radial through-holes filled with a resin, and
   wherein said holding member is provided with openings in communication with the radial through-holes in the holding member of the multipole lens to inject the resin into the radial through-holes.

12. A charged-particle beam instrument fitted with a multipole lens as set forth in claim 11, wherein a sealing member is mounted on opposite radial ends of the radial through-holes in the holding member of the multipole lens.

13. A charged-particle beam instrument fitted with a multipole lens as set forth in claim 11, wherein the resin filling the radial through-holes in the holding member of the multipole lens is a two-component epoxy-based resin.

14. A charged-particle beam instrument fitted with a multipole lens as set forth in claim 11, wherein the multipole lens further includes an annular yoke magnetically coupled to outer radial ends of the polar elements.

15. A charged-particle beam instrument fitted with a multipole lens as set forth in claim 11, wherein the charged-particle beam is an electron beam.

* * * * *